US007788055B2

(12) United States Patent
Walker Colsch et al.

(10) Patent No.: US 7,788,055 B2
(45) Date of Patent: Aug. 31, 2010

(54) METHOD AND SYSTEM OF CALIBRATING SENSING COMPONENTS IN A CIRCUIT BREAKER SYSTEM

(75) Inventors: Susan Jean Walker Colsch, Shellsburg, IA (US); William Davison, Cedar Rapids, IA (US); David Joseph Dunne, Cedar Rapids, IA (US); Kevin John Malo, Iowa City, IA (US); Steve M. Meehleder, Cedar Rapids, IA (US); Ryan James Moffitt, Coralville, IA (US); Richard Allen Studer, II, Wesley, IA (US); Gary Michael Stumme, Cedar Rapids, IA (US)

(73) Assignee: Square D Company, Palatine, IL (US)

( * ) Notice: Subject to any disclaimer, the term of this patent is extended or adjusted under 35 U.S.C. 154(b) by 514 days.

(21) Appl. No.: 11/824,652

(22) Filed: Jul. 2, 2007

(65) Prior Publication Data

US 2008/0215278 A1 Sep. 4, 2008

Related U.S. Application Data

(60) Provisional application No. 60/831,006, filed on Jul. 14, 2006.

(51) Int. Cl.
*G01D 18/00* (2006.01)
*G01D 21/00* (2006.01)
*G01M 19/00* (2006.01)
*G01P 21/00* (2006.01)
*G01R 35/00* (2006.01)

(52) U.S. Cl. ........................................................ 702/85

(58) Field of Classification Search ................... 702/85, 702/104, 107, 115–117, 64, 65, 58, 59, 112; 324/76.11, 415, 424, 601

See application file for complete search history.

(56) References Cited

U.S. PATENT DOCUMENTS 4,301,435 A 11/1981 Castonguay et al. .......... 335/26

(Continued)

FOREIGN PATENT DOCUMENTS

EP 0 303 994 A 2/1989

(Continued)

OTHER PUBLICATIONS

Written Opinion corresponding to co-pending International Patent Application Serial No. PCT/US2007/015914, European Patent Office, dated Mar. 14, 2008, 8 pages.

(Continued)

*Primary Examiner*—Michael P Nghiem

(57) ABSTRACT

A method and system to calibrate a motor circuit protection device is disclosed. An example method calibrates a signal chain of a circuit breaker. The signal chain includes a current transformer, a burden resistor, a stored energy circuit and a controller. The circuit breaker includes a memory coupled to the controller. A calibration instruction routine is written in a first location of the memory. A test current is injected in the circuit breaker signal chain. The test current peak of the test current in the circuit breaker signal chain is measured. Data indicative of the test current peak is stored in a second location of the memory. The test current peak data is read from the second location of the memory. The test current peak data is compared with nominal current data related to the signal chain remotely from the circuit breaker. A calibration factor is determined based on the comparison.

22 Claims, 11 Drawing Sheets

U.S. PATENT DOCUMENTS

| | | | | |
|---|---|---|---|---|
| 4,679,019 | A | 7/1987 | Todaro et al. | 335/172 |
| 4,951,052 | A | 8/1990 | Jacob et al. | 341/122 |
| 4,992,723 | A | 2/1991 | Zylstra et al. | 323/284 |
| 5,014,025 | A | 5/1991 | Papallo, Jr. et al. | 335/167 |
| 5,124,875 | A | 6/1992 | Ishii et al. | 361/93 |
| 5,276,416 | A | 1/1994 | Ozaki | 335/18 |
| 5,343,179 | A | 8/1994 | Pipich et al. | 335/167 |
| 5,510,773 | A | 4/1996 | Rodgers | 340/638 |
| 5,646,586 | A | 7/1997 | Castonguay et al. | 335/132 |
| 5,666,256 | A | 9/1997 | Zavis et al. | 361/115 |
| 5,670,923 | A | 9/1997 | Gonzalez et al. | 335/177 |
| 5,701,111 | A | 12/1997 | Castonguay et al. | 335/177 |
| 5,710,399 | A | 1/1998 | Castonguay et al. | 200/17 R |
| 6,009,615 | A | 1/2000 | McKean et al. | 29/602.1 |
| 6,031,195 | A | 2/2000 | Meili et al. | 200/318 |
| 6,061,217 | A | 5/2000 | Grunert et al. | 361/42 |
| 6,084,756 | A | 7/2000 | Doring et al. | 361/45 |
| 6,154,115 | A | 11/2000 | Flohr | 337/13 |
| 6,351,232 | B1 | 2/2002 | Marie | 341/155 |
| 6,459,349 | B1 * | 10/2002 | Giday et al. | 336/178 |
| 7,307,504 | B1 | 12/2007 | Carlino et al. | 336/213 |
| 2002/0121948 | A1 * | 9/2002 | Giday et al. | 335/18 |
| 2002/0145416 | A1 | 10/2002 | Attarian et al. | 324/127 |
| 2003/0184931 | A1 * | 10/2003 | Morris | 361/42 |
| 2005/0083616 | A1 * | 4/2005 | Reid et al. | 361/42 |
| 2008/0012666 | A1 * | 1/2008 | Davison et al. | 335/18 |
| 2008/0012669 | A1 * | 1/2008 | Davison et al. | 335/44 |
| 2008/0013238 | A1 * | 1/2008 | Colsch et al. | 361/93.2 |
| 2008/0186023 | A1 * | 8/2008 | Biziere et al. | 324/252 |

FOREIGN PATENT DOCUMENTS

| | | | |
|---|---|---|---|
| EP | 0 477 936 | A | 4/1992 |
| EP | 0 580 473 | A | 1/1994 |
| GB | 397 635 | A | 8/1933 |
| GB | 1 293 134 | A | 10/1972 |
| GB | 2 360 135 | A | 9/2001 |
| WO | WO 2006/087342 | A1 | 8/2006 |

OTHER PUBLICATIONS

International Search Report corresponding to co-pending International Patent Application Serial No. PCT/US2007/015914, European Patent Office, dated Mar. 14, 2008, 8 pages.

* cited by examiner

METHOD AND SYSTEM OF CALIBRATING SENSING COMPONENTS IN A CIRCUIT BREAKER SYSTEM

RELATED APPLICATION

The present application claims the benefit of U.S. Provisional Application Ser. No. 60/831,006, filed Jul. 14, 2006, titled: "Motor Circuit Protector," and hereby incorporates that application by reference in its entirety.

FIELD OF THE INVENTION

The present invention relates generally to circuit breaker devices, and, in particular, to the calibration of components in an electronically controlled circuit breaker.

BACKGROUND OF THE INVENTION

As is well known, a circuit breaker is an automatically operated electro-mechanical device designed to protect a conductor from damage caused by an overload or a short circuit. Circuit breakers may also be utilized to protect loads. A circuit breaker may be tripped by an overload or short circuit, which causes an interruption of power to the load. A circuit breaker can be reset (either manually or automatically) to resume current flow to the load. One application of circuit breakers is to protect motors as part of a motor control center ("MCC"). A typical MCC includes a temperature triggered overload relay, a contactor and a motor circuit protector ("MCP"). The MCP is a specialized circuit breaker that provides instantaneous protection against instantaneous short-circuit events. These motor circuit protector devices must meet National Electric Code ("NEC") requirements when installed as part of a UL-listed MCC to provide instantaneous short-circuit protection.

Mechanical circuit breakers energize an electro-magnetic device such as a solenoid to trip instantaneously in response to a rapid surge in current such as a short circuit. Existing MCPs protect only a limited range of motors, but should avoid tripping in response to in-rush motor currents that occur during motor start-up while tripping on a range of fault currents including instantaneous short-circuit currents. In order to provide protection for a full range of motors with different current ratings, different MCP circuit breakers that match the operating parameters of the particular motor must be designed for each current rating. Each MCP circuit breaker is designed with specific trip point settings for a given current rating. Thus, many circuit breaker models must be offered to cover a full range of currents.

Currently calibration for mechanical MCPs is performed mechanically by adjusting a screw that adjusts the trip level of the breaker by changing the position of a cross bar until the output matches a test value. This method has the disadvantage of having to take time to measure a test value, adjust the screw, and secure the mechanism for the production unit. These steps add time and expense to production. Such calibration may also result in drifting over time.

Existing calibration methods are part of the manufacturing process and are not incorporated into the product design process. What is needed, therefore, is a process to calibrate the signal chain of a motor circuit protector as part of the design process. Another need is to provide a calibration process to use the saturation region of current transformers to increase the operating parameters of a circuit breaker. There is also a need for a calibration process that may be adjusted via programming without altering the basic test process.

SUMMARY OF THE INVENTION

Briefly, various aspects of the embodiments disclosed herein are directed to calibration of variable components of a low-cost current measurement signal chain in a circuit breaker, such as a motor circuit protector, to achieve accurate current measurement. The signal chain includes one or more current transformers, a serpentine copper resistor, the $R_{ds,on}$ of a FET, a microcontroller, a voltage regulator for an A/D reference, and a temperature sensor. The current transformers have a characteristic $V_{out}$ to $V_{in}$ over the range of the product under calibration. The product's range is in the saturated and linear region of the characteristic curve of the current transformer. The characteristic output of the current transformer is provided to the functional tester prior to calibration.

The calibration of the product is extended to the design process rather than just to the manufacturing process. Calibration responsibility can be seamlessly integrated between the manufacturing and design functions. In addition, the calibration techniques disclosed herein store the nominal templates during the design process at high temperatures, such as 90° C., and scaling is performed on this elevated nominal calibration template. An advantage of high temperature calibration is that the circuit breaker will be less prone to nuisance tripping when errors occur in the temperature calibration system.

In various aspects of the embodiments disclosed herein, the temperature sensor measures temperature based on the voltage across the p-n junction of a BJT as it varies with temperature. The BJT reacts quickly to shifts in temperature. The temperature sensor is calibrated to a reference temperature on the functional tester. The temperature of the circuit board is important because the burden resistance includes the resistance of the serpentine copper resistor and the $R_{ds,on}$ of the FET. The resistance of the FET and the copper resistor combination changes at a rate of 0.393 percent per degree C.

A test current is independently injected into each of the three current transformers from the functional tester and the response of the current transformers is read from the microcontroller. The responses of the current transformers to the injected currents, and the temperature of the circuit board are used to scale the characteristic curves of the transformer to provide a curve that will fit the system as a whole, i.e., the current transformers and the circuit board. This process eliminates error from the voltage reference, some of the A/D error, and error associated with the burden resistor and FET $R_{ds,on}$.

The foregoing and additional aspects of the present invention will be apparent to those of ordinary skill in the art in view of the detailed description of various embodiments, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

Figure 1:
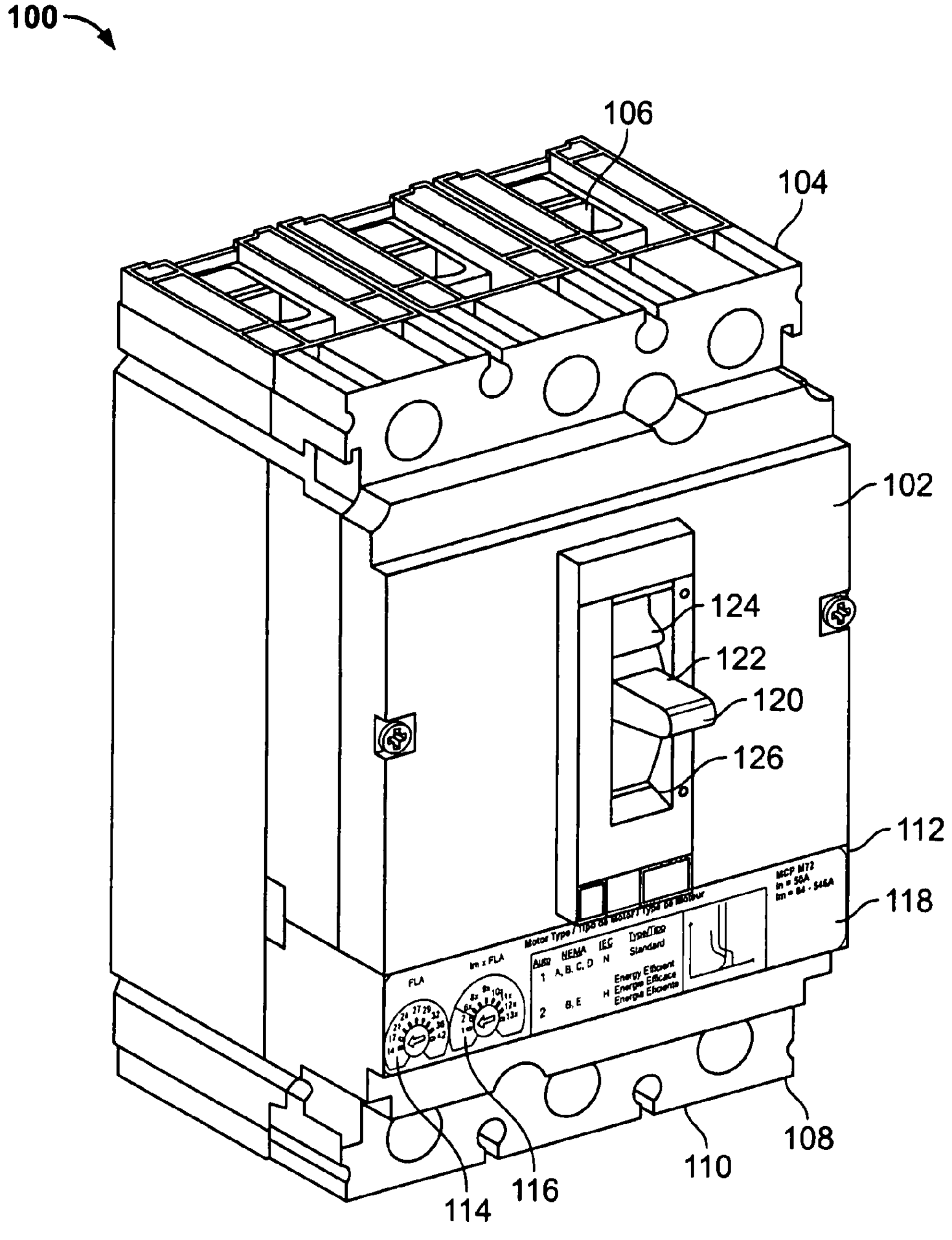
FIG. 1 is perspective view of a motor circuit protector according to the present application.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE ILLUSTRATED EMBODIMENTS

Turning now to FIG. 1, an electronic motor circuit protector 100 is shown. The motor circuit protector 100 includes a durable housing 102 including a line end 104 having line terminals 106 and a load end 108 having load lugs or terminals 110. The line terminals 106 allow the motor circuit protector 100 to be coupled to a power source and the load terminals 110 allow the motor circuit protector 100 to be coupled to an electrical load such as a motor as part of a motor control center ("MCC"). In this example the motor circuit protector 100 includes a three-phase circuit breaker with three poles, although the concepts described below may be used with circuit protectors with different numbers of poles, including a single pole.

The motor circuit protector 100 includes a control panel 112 with a full load ampere ("FLA") dial 114 and an instantaneous trip point ("$I_m$") dial 116 which allows the user to configure the motor circuit protector 100 for a particular type of motor to be protected within the rated current range of the motor circuit protector 100. The full load ampere dial 114 allows a user to adjust the full load which may be protected by the motor circuit protector 100. The instantaneous trip point dial 116 has settings for automatic protection (three levels in this example) and for traditional motor protection of a trip point from 8 to 13 times the selected full load amperes on the full load ampere dial 114. The dials 114 and 116 are located next to an instruction graphic 118 giving guidance to a user on the proper settings for the dials 114 and 116. In this example, the instruction graphic 118 relates to NEC recommended settings for the dials 114 and 116 for a range of standard motors. The motor circuit protector 100 includes a breaker handle 120 that is moveable between a TRIPPED position 122 (shown in FIG. 1), an ON position 124 and an OFF position 126. The position of the breaker handle 120 indicates the status of the motor circuit protector 100. For example, in order for the motor circuit protector 100 to allow power to flow to the load, the breaker handle 120 must be in the ON position 124 allowing power to flow through the motor circuit protector 100. If the circuit breaker is tripped, the breaker handle 120 is moved to the TRIPPED position 122 by a disconnect mechanism, causing an interruption of power and disconnection of downstream equipment. In order to activate the motor circuit protector 100 to provide power to downstream equipment or to reset the motor circuit protector 100 after tripping the trip mechanism, the breaker handle 120 must be moved manually from the TRIPPED position 120 to the OFF position 126 and then to the ON position 124.

Figure 2:
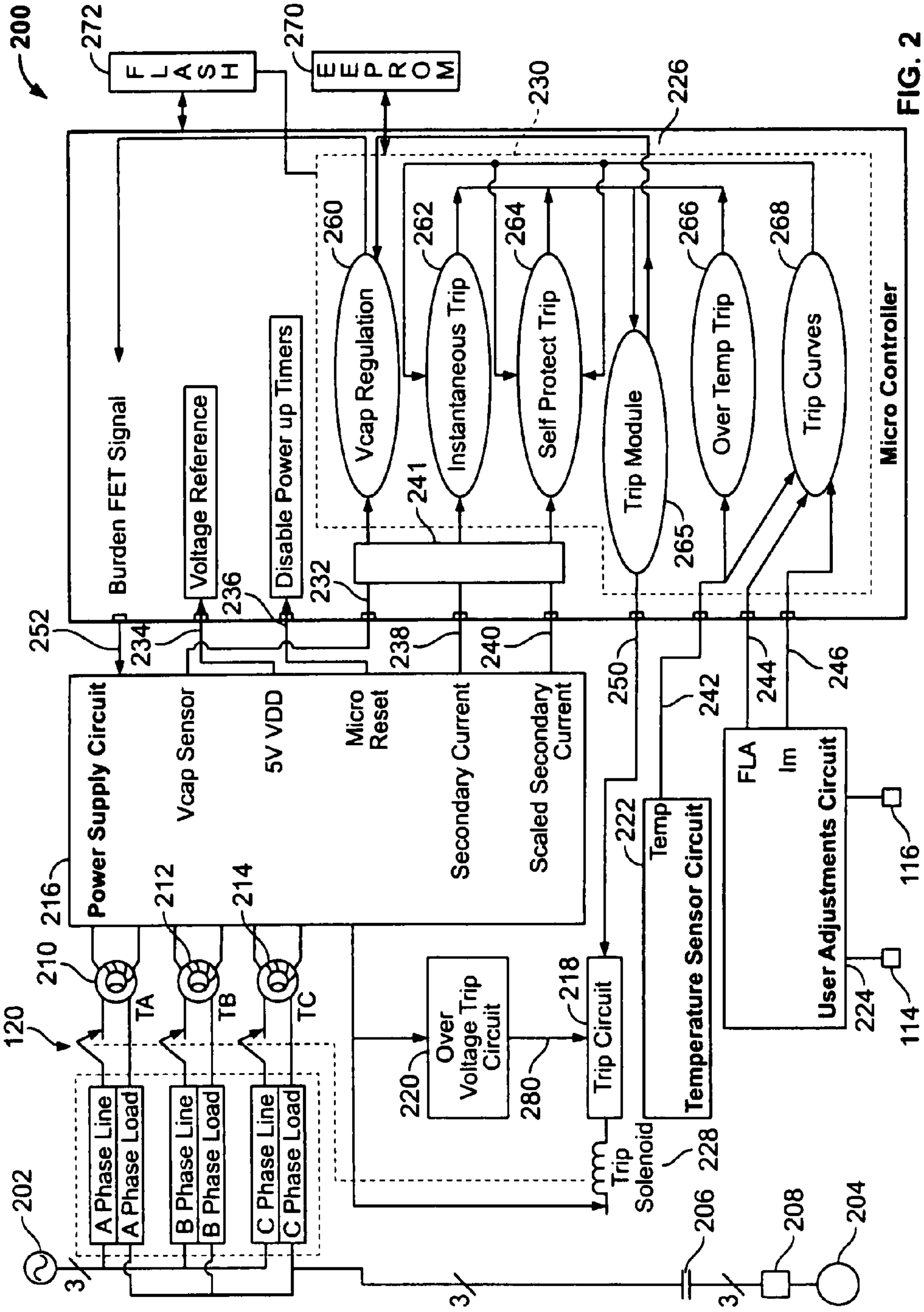
FIG. 2 is a functional block diagram of the motor circuit protector in FIG. 1.

FIG. 2 is a functional block diagram of the motor circuit protector 100 in FIG. 1 as part of a typical MCC configuration 200 coupled between a power source 202 and an electrical load such as a motor 204. The MCC configuration 200 also includes a contactor 206 and an overload relay 208 downstream from the power source 202. Other components such as a variable speed drive, start/stop switches, fuses, indicators and control equipment may reside either inside the MCC configuration 200 or outside the MCC configuration 200 between the power source 202 and the motor 204. The motor circuit protector 100 protects the motor 204 from a short circuit condition by actuating the trip mechanism, which causes the breaker handle 120 to move to the TRIPPED position when instantaneous short-circuit conditions are detected. The power source 202 in this example is connected to the three line terminals 106, which are respectively coupled to the primary windings of three current transformers 210, 212 and 214. Each of the current transformers 210, 212 and 214 has a phase line input and a phase load output on the primary winding. The current transformers 210, 212 and 214 correspond to phases A, B and C from the power source 202. The current transformers 210, 212 and 214 in this example are iron-core transformers and function to sense a wide range of currents. The motor circuit protector 100 provides instantaneous short-circuit protection for the motor 204.

The motor circuit protector 100 includes a power supply circuit 216, a trip circuit 218, an over-voltage trip circuit 220, a temperature sensor circuit 222, a user adjustments circuit 224, and a microcontroller 226. In this example, the microcontroller 226 is a PIC16F684-E/ST programmable microcontroller, available from Microchip Technology, Inc. based in Chandler, Ariz., although any suitable programmable controller, microprocessor, processor, etc. may be used. The microcontroller 226 includes current measurement circuitry 241 that includes a comparator and an analog-to-digital converter. The trip circuit 218 sends a trip signal to an electro-mechanical trip solenoid 228, which actuates a trip mechanism, causing the breaker handle 120 in FIG. 1 to move from the ON position 124 to the TRIPPED position 122, thereby interrupting power flow to the motor 204. In this example, the electro-mechanical trip solenoid 228 is a magnetic latching solenoid that is actuated by either stored energy from a discharging capacitor in the power supply circuit 216 or directly from secondary current from the current transformers 210, 212 and 214.

The signals from the three current transformers 210, 212 and 214 are rectified by a conventional three-phase rectifier circuit (not shown in FIG. 2), which produces a peak secondary current with a nominally sinusoidal input. The peak secondary current either fault powers the circuits 216, 218, 220, 222, and 224 and the microcontroller 226, or is monitored to sense peak fault currents. The default operational mode for current sensing is interlocked with fault powering as will be explained below. A control algorithm 230 is responsible for, inter alia, charging or measuring the data via analog signals representing the stored energy voltage and peak current presented to configurable inputs on the microcontroller 226. The control algorithm 230 is stored in a memory that can be located in the microcontroller 226 or in a separate memory device 272, such as a flash memory. The control algorithm 230 includes machine instructions that are executed by the microcontroller 226. All software executed by the microcontroller 226 including the control algorithm 230 complies with the software safety standard set forth in UL-489 SE and can also be written to comply with IEC-61508. The software requirements comply with UL-1998. As will be explained below, the configurable inputs may be configured as analog-to-digital ("A/D") converter inputs for more accurate comparisons or as an input to an internal comparator in the current measurement circuitry 241 for faster comparisons. In this example, the A/D converter in the current measurement circuitry 241 has a resolution of 8/10 bits, but more accurate A/D converters may be used and may be separate and coupled to the microcontroller 226. The output of the temperature sensor circuit 222 may be presented to the A/D converter inputs of the microcontroller 226.

The configurable inputs of the microcontroller 226 include a power supply capacitor input 232, a reference voltage input 234, a reset input 236, a secondary current input 238, and a scaled secondary current input 240, all of which are coupled to the power supply circuit 216. The microcontroller 226 also includes a temperature input 242 coupled to the temperature sensor circuit 222, and a full load ampere input 244 and an instantaneous trip point input 246 coupled to the user adjustments circuit 224. The user adjustments circuit 224 receives inputs for a full load ampere setting from the full load ampere dial 114 and either a manual or automatic setting for the instantaneous trip point from the instantaneous trip point dial 116.

The microcontroller 226 also has a trip output 250 that is coupled to the trip circuit 218. The trip output 250 outputs a trip signal to cause the trip circuit 218 to actuate the trip solenoid 228 to trip the breaker handle 120 based on the conditions determined by the control algorithm 230. The microcontroller 226 also has a burden resistor control output 252 that is coupled to the power supply circuit 216 to activate current flow across a burden resistor (not shown in FIG. 2) and maintain regulated voltage from the power supply circuit 216 during normal operation.

The breaker handle 120 controls manual disconnect operations allowing a user to manually move the breaker handle 120 to the OFF position 126 (see FIG. 1). The trip circuit 218 can cause a trip to occur based on sensed short circuit conditions from either the microcontroller 226, the over-voltage trip circuit 220 or by installed accessory trip devices, if any. As explained above, the microcontroller 226 makes adjustment of short-circuit pickup levels and trip-curve characteristics according to user settings for motors with different current ratings. The current path from the secondary output of the current transformers 210, 212, 214 to the trip solenoid 228 has a self protection mechanism against high instantaneous fault currents, which actuates the breaker handle 120 at high current levels according to the control algorithm 230.

The over-voltage trip circuit 220 is coupled to the trip circuit 218 to detect an over-voltage condition from the power supply circuit 216 to cause the trip circuit 218 to trip the breaker handle 120 independently of a signal from the trip output 250 of the microcontroller 226. The temperature sensor circuit 222 is mounted on a circuit board proximate to a copper burden resistor (not shown in FIG. 2) together with other electronic components of the motor circuit protector 100. The temperature sensor circuit 222 and the burden resistor are located proximate each other to allow temperature coupling between the copper traces of the burden resistor and the temperature sensor. The temperature sensor circuit 222 is thermally coupled to the power supply circuit 216 to monitor the temperature of the burden resistor. The internal breaker temperature is influenced by factors such as the load current and the ambient temperatures of the motor circuit protector 100. The temperature sensor 222 provides temperature data to the microcontroller 226 to cause the trip circuit 218 to actuate the trip solenoid 228 if excessive heat is detected. The output of the temperature sensor circuit 222 is coupled to the microcontroller 226, which automatically compensates for operation temperature variances by automatically adjusting trip curves upwards or downwards.

The microcontroller 226 first operates the power supply circuit 216 in a startup mode when a reset input signal is received on the reset input 236. A charge mode provides voltage to be stored for actuating the trip solenoid 228. After a sufficient charge has been stored by the power supply circuit 216, the microcontroller 226 shifts to a normal operation mode and monitors the power supply circuit 216 to insure that sufficient energy exists to power the electro-mechanical trip solenoid 228 to actuate the breaker handle 120. During each of these modes, the microcontroller 226 and other components monitor for trip conditions.

The control algorithm 230 running on the microcontroller 226 includes a number of modules or subroutines, namely, a voltage regulation module 260, an instantaneous trip module 262, a self protection trip module 264, an over temperature trip module 266 and a trip curves module 268. The modules 260, 262, 264, 266 and 268 generally control the microcontroller 226 and other electronics of the motor circuit protector 100 to perform functions such as governing the startup power, establishing and monitoring the trip conditions for the motor circuit protector 100, and self protecting the motor circuit protector 100. A storage device 270, which in this example is an electrically erasable programmable read only memory (EEPROM), is coupled to the microcontroller 226 and stores data accessed by the control algorithm 230 such as trip curve data and calibration data as well as the control algorithm 230 itself. Alternately, instead of being coupled to the microcontroller 226, the EEPROM may be internal to the microcontroller 226.

Figure 3:
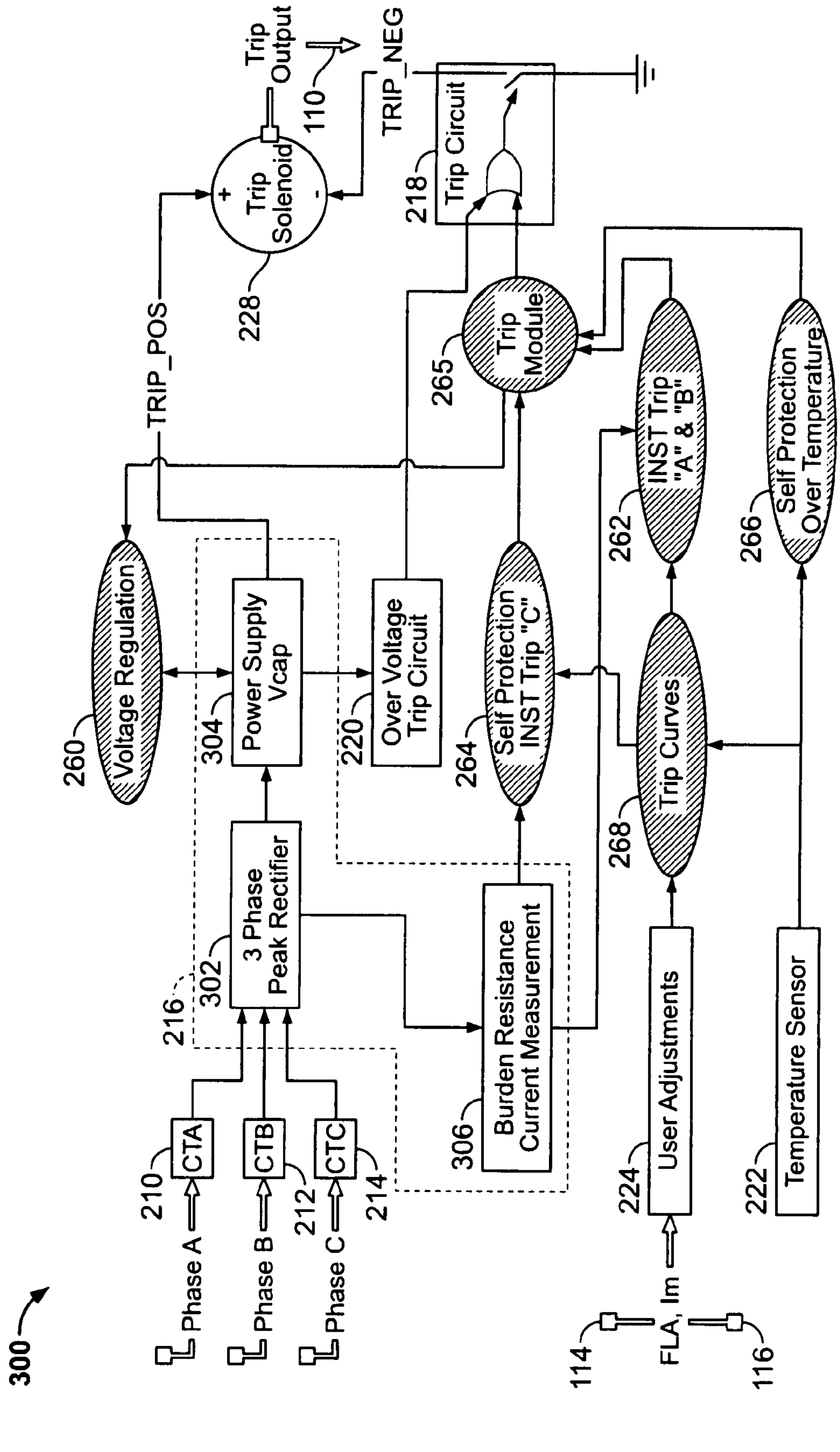
FIG. 3 is a functional block diagram of the operating components of a control algorithm of the motor circuit protector in FIG. 1.

FIG. 3 is a functional block diagram 300 of the interrelation between the hardware components shown in FIG. 2 and software/firmware modules 260, 262, 264, 266 and 268 of the control algorithm 230 run by the microcontroller 226. The secondary current signals from the current transformers 210, 212 and 214 are coupled to a three-phase rectifier 302 in the power supply circuit 216. The secondary current from the three-phase rectifier 302 charges a stored energy circuit 304 that supplies sufficient power to activate the trip solenoid 228 when the trip circuit 218 is activated. The voltage regulation module 260 ensures that the stored energy circuit 304 maintains sufficient power to activate the trip solenoid 228 in normal operation of the motor circuit protector 100.

The trip circuit 218 may be activated in a number of different ways. As explained above, the over-voltage trip circuit 220 may activate the trip circuit 218 independently of a signal from the trip output 250 of the microcontroller 226. The microcontroller 226 may also activate the trip circuit 218 via a signal from the trip output 250, which may be initiated by the instantaneous trip module 262, the self protection trip module 264, or the over temperature trip module 266. For example, the instantaneous trip module 262 of the control algorithm 230 sends a signal from the trip output 250 to cause the trip circuit 218 to activate the trip solenoid 228 when one of several regions of a trip curve are exceeded. For example, a first trip region A is set just above a current level corresponding to a motor locked rotor. A second trip region B is set just above a current level corresponding to an in-rush current of a motor. The temperature sensor circuit 222 outputs a signal indicative of the temperature, which is affected by load current and ambient temperature, to the over temperature trip module 266. The over temperature trip module 266 will trigger the trip circuit 218 if the sensed temperature exceeds a specific threshold. For example, load current generates heat internally by flowing through the current path components, including the burden resistor, and external heat is conducted from the breaker lug connections. A high fault current may cause the over temperature trip module 266 to output a trip signal 250 (FIG. 2) because the heat conducted by the fault current will cause the temperature sensor circuit 222 to output a high temperature. The over temperature trip module 266 protects the printed wire assembly from excessive temperature buildup that can damage the printed wire assembly and its components. Alternately, a loose lug connection may also cause the over temperature trip module 266 to output a trip signal 250 if sufficient ambient heat is sensed by the temperature sensor circuit 222.

The trip signal 250 is sent to the trip circuit 218 to actuate the solenoid 228 by the microcontroller 226. The trip circuit 218 may actuate the solenoid 228 via a signal from the over-voltage trip circuit 220. The requirements for "Voltage Regulation," ensure a minimum power supply voltage for "Stored Energy Tripping." The trip circuit 218 is operated by the microcontroller 226 either by a "Direct Drive" implementation during high instantaneous short circuits or by the control algorithm 230 first ensuring that a sufficient power supply voltage is present for the "Stored Energy Trip." In the case where the "Stored Energy" power supply voltage has been developed, sending a trip signal 250 to the trip circuit 218 will ensure trip activation. During startup, the power supply 216 may not reach full trip voltage, so a "Direct Drive" trip operation is required to activate the trip solenoid 228. The control for Direct Drive tripping requires a software comparator output sense mode of operation. When the comparator trip threshold has been detected, the power supply charging current is applied to directly trip the trip solenoid 228, rather than waiting for full power supply voltage.

The over-voltage trip circuit 220 can act as a backup trip when the system 200 is in "Charge Mode." The control algorithm 230 must ensure "Voltage Regulation," so that the over-voltage trip circuit 220 is not inadvertently activated. The default configuration state of the microcontroller 226 is to charge the power supply 216. In microcontroller control fault scenarios where the power supply voltage exceeds the over voltage trip threshold, the trip circuit 218 will be activated. Backup Trip Levels and trip times are set by the hardware design.

The user adjustments circuit 224 accepts inputs from the user adjustment dials 114 and 116 to adjust the motor circuit protector 100 for different rated motors and instantaneous trip levels. The dial settings are converted by a potentiometer to distinct voltages, which are read by the trip curves module 268 along with temperature data from the temperature sensor circuit 222. The trip curves module 268 adjusts the trip curves that determine the thresholds to trigger the trip circuit 218. A burden circuit 306 in the power supply circuit 216 allows measurement of the secondary current signal, which is read by the instantaneous trip module 262 from the peak secondary current analog-to-digital input 238 (shown in FIG. 2) along with the trip curve data from the trip curves module 268. The self-protection trip module 264 also receives a scaled current (scaled by a scale factor of the internal comparator in the current measurement circuitry 241) from the burden resistor in the burden circuit 306 to determine whether the trip circuit 218 should be tripped for self protection of the motor circuit protector 100. In this example, fault conditions falling within this region of the trip curve are referred to herein as falling within region C of the trip curve.

As shown in FIGS. 2 and 3, a trip module 265 is coupled between the trip circuit 218 and the voltage regulation module 260. Trip signals from the instantaneous trip module 262, the self protection trip module 264, and the over temperature trip module 266 are received by the trip module 265.

The following terms may be used herein:

DIRECT DRIVE—Initiating a trip sequence using the secondary current from the current transformer 210, 212, 214 to energize the trip solenoid 228 rather than using energy stored in the stored energy circuit 304. A direct drive sequence can be carried out prior to or after achieving a stored energy trip voltage.

STORED ENERGY TRIP—Sending a trip sequence with knowledge of the stored energy trip voltage on the power supply voltage, $V_{CAP}$, 304 using the energy stored in the stored energy circuit 304 to energize the trip solenoid 228.

REDUNDANT TRIP OUTPUT—Send both "trip output" to the trip circuit 218 and "FET off" output to the power supply circuit 216 if the digital trip output was not successful. This will eventually cause the over-voltage circuit 220 to activate the trip solenoid 228.

OVER-VOLTAGE TRIP BACKUP—A trip sequence that uses the over-voltage trip circuit 220 to trip the breaker. This sequence is a backup for the normal "trip circuit" method. This sequence can be activated later in time due to a higher $V_{CAP}$ 304 activation voltage.

Figure 4:
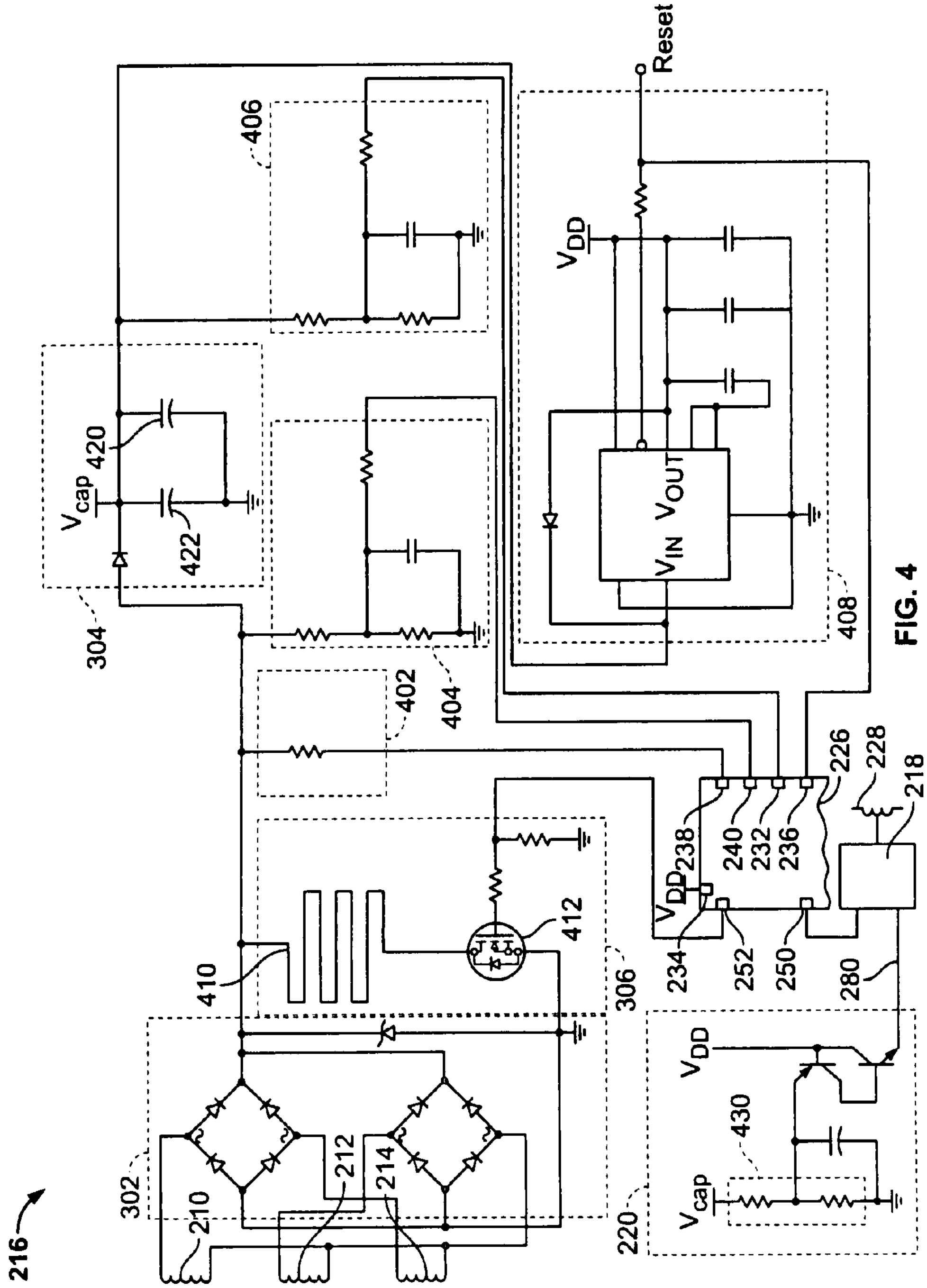
FIG. 4 is a circuit diagram of the stored energy circuit and associated components of the motor circuit protector in FIG. 1.

FIG. 4 is a detailed circuit diagram of various circuits of the motor circuit protector 100, including the power supply circuit 216 and other related components including the stored energy circuit 304, the burden circuit 306, a scaled current comparator current input 404, an energy storage capacitor voltage input circuit 406, and a voltage regulator circuit 408. The power supply circuit 216 derives the secondary current from the secondary windings of the three current transformers 210, 212, and 214, which are rectified by the three-phase rectifier 302. The output of the three-phrase rectifier 302 is coupled to the burden circuit 306, which is coupled in parallel to the stored energy circuit 304. The power supply circuit 216 also includes a peak current input circuit 402 that is provided to the microcontroller 226, a scaled current comparator input circuit 404 that is provided to the comparator of the current measurement circuitry 241 of the microcontroller 226 via the scaled secondary current input 240, a stored energy capacitor voltage input circuit 406 and a voltage regulator circuit 408. The stored energy capacitor input 232 of the microcontroller 226 is coupled to the stored energy capacitor input circuit 406, the reference voltage input 234 is coupled to the voltage regulator circuit 408, the secondary current input 238 is coupled to the peak current input circuit 402, and the scaled secondary current input 240 is coupled to the scaled current comparator input circuit 404.

The burden circuit 306 includes a burden resistor 410 connected in series with a burden resistor control field effect transistor (FET) 412. The gate of the burden resistor control FET 412 is coupled to the burden resistor control output 252 of the microcontroller 226. Turning on the burden resistor control FET 412 creates a voltage drop across the burden resistor 410 and the burden resistor control FET 412 allowing measurement of the secondary current for fault detection purposes. The voltage drop may also provide an indication of current available to charge the stored energy circuit 304.

The secondary current from the rectifier 302 is measured by the peak current input circuit 402 and the scaled current comparator input circuit 404. The stored energy circuit 304 includes two energy storage capacitors 420 and 422. The energy storage capacitors 420 and 422 are charged by the secondary current when the burden resistor control FET 412 is switched off and are discharged by the trip circuit 218 to actuate the trip solenoid 228 in FIG. 2.

The scaled current comparator input circuit 404 has an input that is coupled to the rectifier 302. The scaled current comparator input circuit 404 includes a voltage divider to scale down the signal from the rectifier 302 and is coupled to the scaled secondary current input 240 of the microcontroller 226. The voltage regulator circuit 408 provides a component power supply (in this example, 5 volts nominal) to the electronic components such as the microcontroller 226 in the motor circuit protector 100. The microcontroller 226 includes two internal comparators in the current measurement circuitry 241 that may compare the input 232 or the input 240 with a reference voltage that is received from the voltage regulator circuit 408 to the reference voltage input 234. The reference voltage is also a reference voltage level when the inputs 232 and 240 are configured to be coupled to analog-to-digital converters. When the internal comparator is switched to receive the input 240 to the self protection trip module 264, the peak current is scaled for the comparator input by external hardware such as the scaled current comparator input circuit 404. An internal comparator reference is set by the microcontroller 226 to control the comparator trip thresholds.

The stored energy capacitor voltage input circuit 406 includes the parallel-connected capacitors 420 and 422 and measures the voltage level of the stored energy circuit 304, which is indicative of the stored energy in the capacitors 420 and 422. The stored energy capacitor voltage input circuit 406 provides a signal indicative of the voltage on the capacitors 420 and 422 to the stored energy capacitor input 232 of the microcontroller 226 to monitor the voltage of the stored energy circuit 304.

Upon startup of the motor circuit protector 100 (such as when the user throws the breaker handle 120 to the ON position), the voltage regulator circuit 408 and the microcontroller 226 receive a reset signal from the power supply circuit 216 and the rectifier 302 begins to charge the capacitors 420 and 422. A start-up delay time including a hardware time delay and a fixed software time delay elapses. The hardware time delay is dependent on the time it takes the secondary current to charge the stored energy circuit 304 to a voltage sufficient to operate the voltage regulator circuit 408. In this example, the voltage regulator circuit 408 needs a minimum of 5 volts (nominal) to operate. The fixed software time delay is the time required for stabilization of the regulated component voltage from the voltage regulator circuit 408 to drive the electronic components of the motor circuit protector 100. The software delay time is regulated by an internal timer on the microcontroller 226. The overall start-up delay time typically covers the first half-cycle of the current.

After the start-up delay time, the microcontroller 226 executes the control algorithm 230, which is optionally stored in the internal memory of the microcontroller 226, and enters a "Self Protection" measurement mode, which relies upon the internal comparator of the microcontroller 226 for rapid detection of fault currents. The microcontroller 226 turns on the burden resistor control FET 412 allowing measurement of the secondary current. The burden resistor control FET 412 is turned on for a fixed period of time regulated by the internal timer on the microcontroller 226. The voltage regulation module 260 configures the microcontroller 226 to couple the scaled secondary current input 240 to an input to the internal comparator of the microcontroller 226. The scaled secondary current input 240 reads the signal from the scaled peak current input circuit 404, which measures the secondary current from the rectifier 302 and requires minimal initializing overhead. The peak current from the secondary current is predicted via the secondary current detected by the scaled current comparator input circuit 404.

The internal comparator in the microcontroller 226 is a relatively fast device (compared to, for example, an A/D converter, which may be more accurate but operates more slowly) and thus can detect fault currents quickly while in this mode. If the peak current exceeds a threshold level, indicating a fault current, the burden resistor control FET 412 is turned off by a signal from the burden resistor control output 252 of the microcontroller 226, and the trip signal 250 is sent to the trip circuit 218. The threshold level is set depending on the desired self-protection model of the range of currents protected by the particular type of motor circuit protector 100. The disconnection of the FET 412 causes the fault current to rapidly charge the capacitors 420 and 422 of the stored energy circuit 304 and actuate the trip solenoid 228 to trip the trip mechanism of the motor circuit protector 100, which is visually indicated by the breaker handle 120.

After the initial measurement is taken, the control algorithm 230 enters into a charge only mode of operation in order to charge the capacitors 420 and 422 of the stored energy circuit 304. The control algorithm 230 sends a signal to turn off the burden resistor control FET 412, causing the capacitors 420 and 422 to be charged. The control algorithm 230 remains in the charge only mode until sufficient energy is stored in the stored energy circuit 304 to actuate the trip solenoid 228 in the event of a detected fault condition. In the charge only mode, the voltage regulation module 260 configures the microcontroller 226 to take a voltage input from the peak current input circuit 402 to the secondary current input 238, which is configured for an analog to digital converter. The signal from the secondary current input 238 analog to digital conversion is more accurate then the internal comparator but relatively slower. During the charge only mode, if a fault current occurs, the stored energy circuit 304 is charged quickly and the fault current actuates the trip solenoid 228 therefore providing self protection.

It should be noted that the control algorithm 230 can be programmed to multiplex current measurement for self-protection sensing and power-supply charging for minimum stored-energy tripping.

The voltage regulation module 260 also configures the internal comparator in the current measurement circuitry 241 to be connected to the stored energy capacitor voltage input circuit 406 via the capacitor voltage input 232 to detect voltage levels from the stored energy circuit 304. The voltage regulation module 260 thus maintains real time monitoring over the regulated voltage output from the stored energy circuit 304 while performing other software tasks such as monitoring fault currents.

During the charge only mode, the control algorithm 230 charges the stored energy circuit 304 from the minimum voltage regulation level (5 volts in this example from the hardware startup period) to a voltage level (15 volts in this example) indicative of sufficient energy to actuate the trip solenoid 228. The charging of the capacitors 420 and 422 is regulated by the voltage regulation module 260, which keeps the burden resistor control FET 412 off via the burden resistor control output 252 causing the capacitors 420 and 422 to charge. The voltage regulation module 260 holds the stored energy circuit 304 in the charge mode until a start voltage threshold level (15 volts in this example) is reached for the supply voltage from the stored energy circuit 304 and is thus sensed through the stored energy capacitor voltage input circuit 406. The timing of when the start voltage threshold level is reached depends on the secondary current from the rectifier 302 to the stored energy circuit 304. The ability of the voltage regulation module 260 to hold the charge mode allows designers to avoid external stability hardware components. This process reduces peak overshoot during high instantaneous startup scenarios while charging the capacitors 420 and 422 to the start voltage threshold level more efficiently.

Once the minimum energy for actuating the trip solenoid 228 is stored, the control algorithm 230 proceeds to a steady state or run mode. In the run mode, the control algorithm 230 maintains control of the voltage from the stored energy circuit 304 with the voltage regulation module 260 after the sufficient energy has been stored for tripping purposes. The voltage regulation module 260 maintains a voltage above the stored energy trip voltage by monitoring the voltage from the stored energy circuit 304 from the stored energy capacitor voltage input circuit 406 to the stored energy capacitor input 232. The stored energy capacitor input 232 is internally configured as an A/D converter input for more accurate voltage level sensing for the run mode.

The voltage regulation module 260 also regulates the stored energy circuit 304 and avoids unintended activation of the over-voltage trip circuit 220. The power supply regulation task is serviced in the run mode on a periodic basis to maintain the necessary energy in the stored energy circuit 304. The regulation task may be pre-empted to service higher priority tasks such as the trip modules 262 and 264. In the run mode, the voltage regulation module 260 monitors the voltage from the stored energy circuit 304. The voltage regulation module 260 maintains the voltage output from the stored energy circuit 304 above the backup trip set points, which include a high set point voltage and a low set point voltage. If the energy falls below a high set point voltage threshold (14.7 volts in this example), the voltage regulation module 260 initiates fixed width charge pulses, by sending control signals via the burden resistor control output 252 to the burden resistor control FET 412 to turn on and off until a high voltage set point for the power supply voltage is reached. The width of the pulse corresponds with the maximum allowable voltage ripple at the maximum charge rate of the stored energy circuit 304. The number of fixed width charge pulses is dependent on the voltage level from the stored energy circuit 304. If the energy is above the high set point voltage, the voltage regulation module 260 will not initiate fixed width charge pulse in order to avoid unintended activation of the over-voltage trip circuit 220.

If the voltage signals detected from the stored energy capacitor voltage input circuit 406 are such that the microcontroller 226 cannot maintain regulation voltage on the stored energy circuit 304, a threshold voltage low set point (13.5 volts in this example) for the stored energy circuit 304 is reached and the control algorithm 230 will charge the stored energy circuit 304 to reach a minimum voltage necessary for trip activation of the trip solenoid 228. The microcontroller 226 will restart the charge mode to recharge the capacitors 420 and 422 in the stored energy circuit 304. During the charging process, fault current measurement is disabled, however if a fault current of significant magnitude occurs, the fault current will rapidly charge the capacitors 420 and 422 of the measured stored energy circuit 304 and thus overall trip performance is not affected. The application will also restart when the watchdog timer in the microcontroller 226 resets.

In the run mode, the microcontroller 226 is in measurement mode by keeping the burden resistor control FET 412 on. The microcontroller 226 monitors the secondary current via the secondary current input 238, which is configured as an analog-to-digital converter for more accurate measurements. The instantaneous trip module 262 sends an interrupt signal from the trip output 250 of the microcontroller 226 to cause the trip circuit 218 to activate the trip solenoid 228 for conditions such as a motor in-rush current or a locked motor rotor (trip conditions A and B), which cause a trip curve to be exceeded based on the secondary current. The internal comparator of the microcontroller 226 is configured to accept an input from the scaled secondary current input 240, which is read by the self protection trip module 264 to determine whether the trip circuit 218 should be tripped for self protection of the motor circuit protector 100 in the case of high instantaneous current (trip condition C) detected from the faster measurement of the comparator. As explained above, the trip conditions for self protection are a function of the user settings from the dials 114 and 116.

In case of a failure of the microcontroller 226 to send the appropriate trip signal 250, the solenoid 228 is triggered by the over voltage trip circuit 220 (shown schematically in FIG. 4). The over voltage trip circuit 220 includes a voltage divider 430, which steps down the voltage level. In this example, pull up transistors cause the over voltage trip circuit 220 to send a discrete trip signal 280 to the trip circuit 218, causing the trip circuit 218 to actuate the trip solenoid 228 to trip the breaker handle 120.

Figure 5:
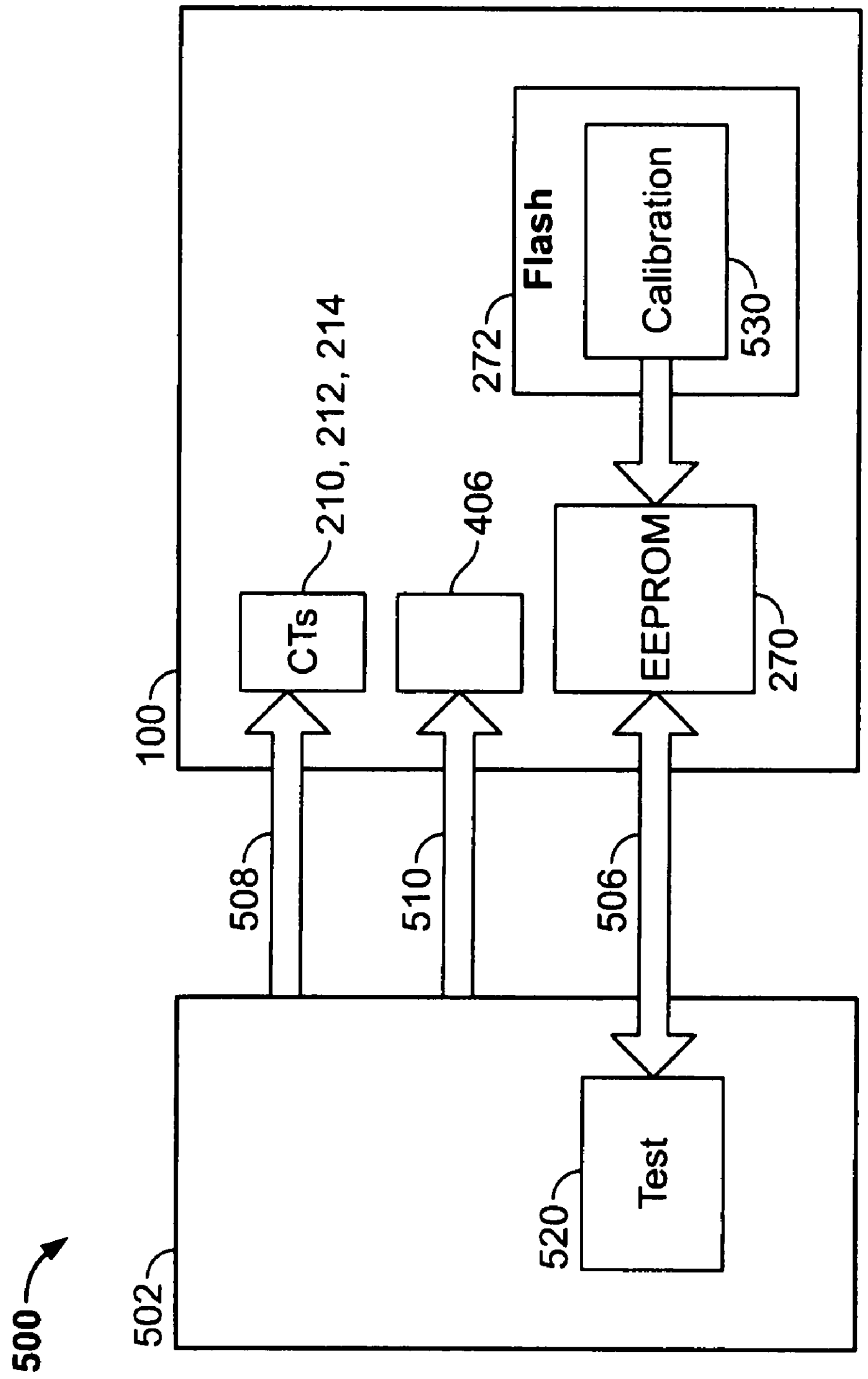
FIG. 5 is a block diagram of a calibration system used to calibrate the operating components of the motor circuit protector in FIG. 1.

The trip curves and other values that determine trip conditions can be calibrated in the motor circuit protector 100. FIG. 5 is a block diagram of a calibration and testing system 500 that calibrates the output responses in a customized calibration table prepared from a nominal template and referenced by the control algorithm 230. The control algorithm 230 along with the customized calibration table with scaled values is transferred into the flash memory 272 of the motor circuit protector 100 in the production and testing process. The scaled values in the customized calibration table are obtained as a result of the calibration process. The calibration and testing system 500 includes a tester unit 502 and a motor circuit protector (also referred to as a device under test or "DUT") to be tested and calibrated such as the motor circuit protector 100 described above. The tester unit 502 includes a communications interface 506 that is in data communication with the EEPROM 270 of the motor circuit protector 100 in the calibration process. The tester unit 502 also includes a current output 508 that is coupled to the current transformers 210, 212 and 214 of the motor circuit protector 100. The current output 508 injects currents to the current transformers 210, 212 and 214 for calibration purposes. The tester unit 502 also includes a signal connector 510 for transmitting additional test data signals to components such as the power supply capacitor input circuit 406. The tester unit 502 includes production test software 520 that provides analysis of the data and determines scaling values for the customized calibration table eventually stored on the EEPROM 270 and accessed by the control algorithm 230. The flash memory 272 is loaded with the calibration software 530 via the communications interface 506. The calibration software 530 implements calibration and testing routines such as current transformer characterization equation calibration, switch testing, temperature sensor testing, voltage input testing, etc. The production test software 520 records sensor readings and current peak detection data obtained by the calibration software 530 by reading the EEPROM 270.

The calibration software 530 acts as a data recorder for sensor readings and input current peaks from the motor circuit protector 100. Under the test process, the signal chain for the current peak injection includes the current transformers 210, 212 and 214, the serpentine copper burden resistor 410, the burden resistor control FET 412, the microcontroller 226, the voltage regulator circuit 408 (or the voltage regulation module 260) and the temperature sensor circuit 222 as shown in FIGS. 3-4. In this example, the calibration software 530 is a Java-based, signal chain simulator. Of course other types of coding language may be used to perform the same functions. Nominal calibration templates may be generated from a spreadsheet program, for example.

In the example testing process, the production test software 520 stimulates the motor circuit protector 100 with power supply, switch, and current signals. In turn the calibration software 530 is loaded in the flash memory 272 and writes the test data to the EEPROM 270. The tester unit 502 includes normalized templates of equipment operating parameters for product calibration of different types of motor circuit protectors (e.g., having different current operating ranges). The normalized templates include expected performance parameters such as trip curves for the type of motor circuit protector 100. The production test software 520 manipulates the template in a restrictive manner for calibration purposes to produce the customized calibration table. Thus, critical calibration information is delivered to the EEPROM 270 in the customized calibration table written by the production test software 520 using data from running the calibration software 530. After the customized calibration table is written in the EEPROM 270, the space in the flash memory 272 storing the calibration software 530 is overwritten with the control algorithm 230. This technique allows calibration changes to be released with calibration software releases and saves flash memory space in the motor circuit protector 100.

Figure 6A:
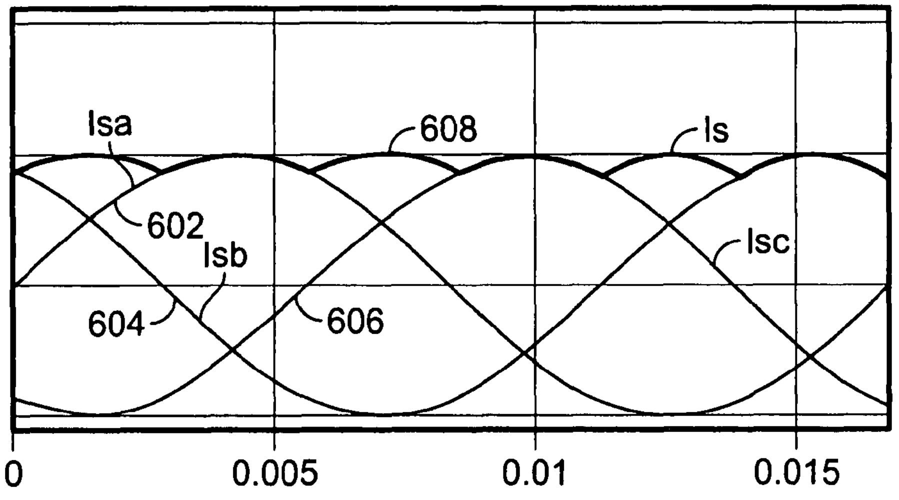
FIGS. 6A and 6B are current waveforms of the primary and secondary currents from current transformers of the motor circuit protector in FIG. 1 in the non-saturated region.
Figure 6B:
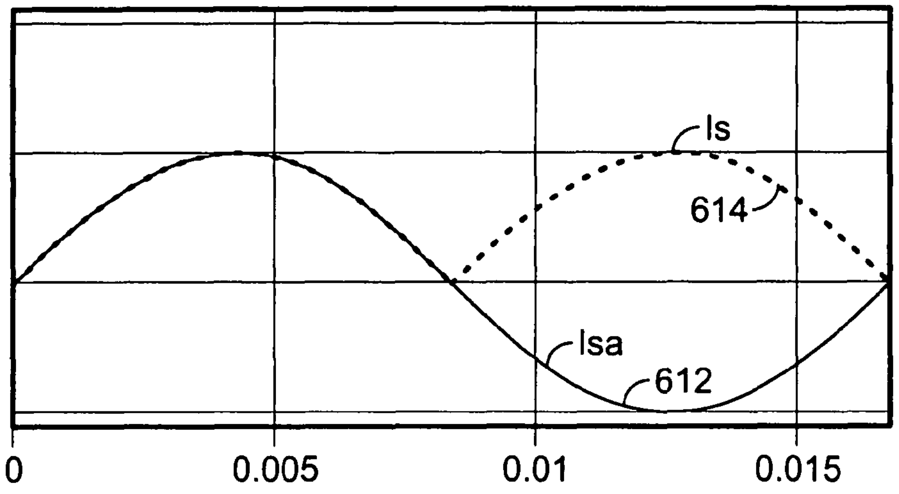
Figure 7:
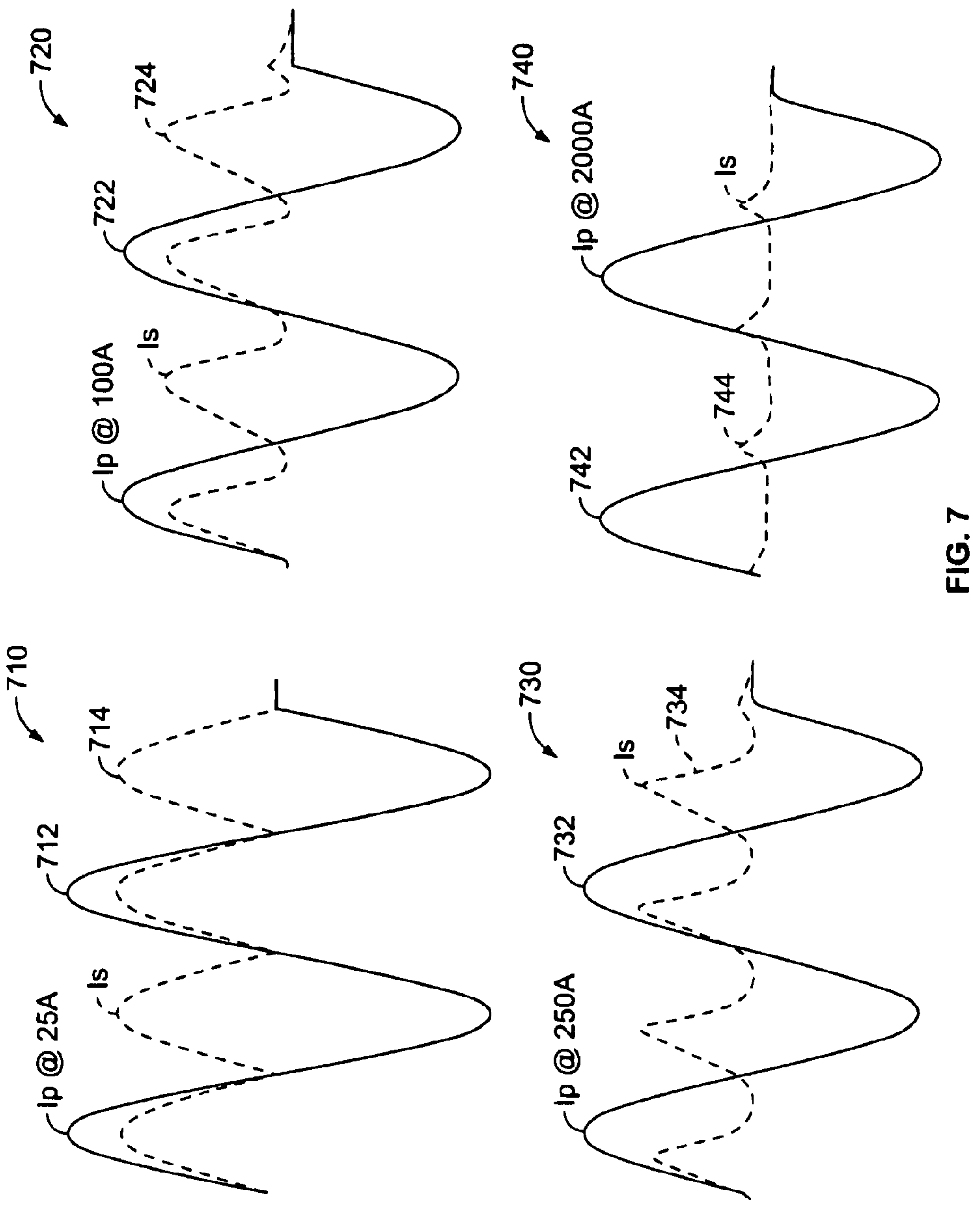
FIG. 7 is a current waveform of the primary and secondary currents from a current transformer of the motor circuit protector in FIG. 1 in the saturated region.

The motor circuit protector 100 is able to operate within a large range of currents by sensing fault currents falling within the saturation region of the current transformers 210, 212 and 214. FIG. 6A shows a set of typical balanced three-phase 60 Hz secondary currents 602, 604 and 606 that are fed into a three-phase rectifier such as the rectifier 302. An ideal peak current output signal 608 from the three-phase rectifier 302 is shown in FIG. 6A. As shown in FIG. 6B, a single-phase secondary current 612 having a phase A, Isa, from the current transformer 210 results in a rectified output current 614 from a rectifier. Depending upon the fault type, the secondary peak current waveform becomes distorted relative to the primary current, as shown in FIG. 7.

The peak secondary current signal waveform will look different depending on the fault type and degree of current transformer saturation. For example, FIG. 7 shows current graphs 710, 720, 730, and 740 of the transfer-function behavior of the current transformer 210 for various fault currents. The current graph 710 includes a primary current waveform 712 at 25A and a corresponding saturated secondary current 714. The current graph 720 includes a primary current waveform 722 at 100A and a corresponding saturated secondary current 724. The current graph 730 includes a primary current waveform 732 at 250A and a corresponding saturated secondary current 734. The current graph 740 includes a primary current waveform 742 at 2000A and a corresponding saturated secondary current 744.

Because the motor circuit protector 100 is operational for currents in the saturation ranges of the current transformers 210, 212, and 214, the secondary current waveforms are not uniform over the entire pickup range of instantaneous fault currents. At sinusoidal primary currents below the saturation of the current transformers 210, 212, and 214, the secondary current signals are also sinusoidal as shown in FIGS. 6A and 6B and sampling errors can be calculated. At high fault current and instantaneous current levels, the secondary current signals are distorted due to being in the saturation region of the current transformers 210, 212, and 214 as shown in FIG. 7. Experimental data determines the maximum peak detection errors. The maximum peak error due to worst case instantaneous current sampling or self protection comparator response is considered in the control algorithm 230 via the normalization template.

Figure 8:
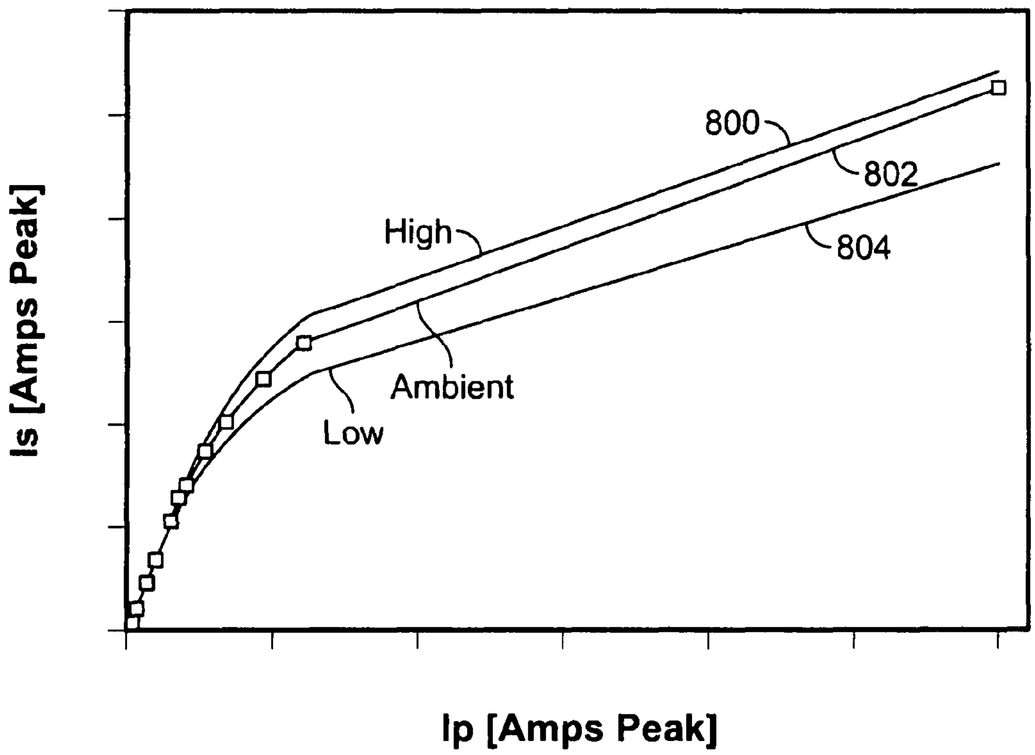
FIG. 8 is a graph of a transfer function of the current transformers in the motor circuit protector in FIG. 1.

The peak secondary currents are predictable over the operating ranges of the motor circuit protector 100. A series of typical current transformer transfer functions 800, 802, and 804 are shown in FIG. 8, where secondary peak currents (y-axis) vary with known primary current signals (x-axis). In this example, the transfer function 800 represents a relatively high temperature (110° C. in this example), the transfer function 802 represents a relatively ambient temperature (25° C. in this example), and the transfer function 804 represents a relatively low temperature (−35° C. in this example). In this example, the current measurement performance of the current transformer is non-linear over both the fault current and high instantaneous current detection ranges that fall in the saturation region of the current transformer. An ideal current transformer has an output predicted by the ratio of secondary turns to primary turns. It is convenient to characterize the current transformers with a parameter known as an "Effective Turns Ratio" at the interested measurement points and normalize the effective turns ratio to the ideal turns ratio. Iron-core current transformers also exhibit temperature performance. The transfer functions for the current transformers in this example take both temperature performance and effective turns ratio into account.

The equations for the transfer functions are developed by part experimentation or by models. The equations are modified by software design to improve the system measurement accuracy where applicable. The equations are mostly for the second half cycle and beyond current signals. Expected first half cycle signal errors depend on the current transformer configuration, closing angle and current magnetization. The transfer function may be expressed generally as the following equation:

$$Is=(Ip_n*C_n)+(Ip_{n-1}*C_{n-1})+\ldots+(Ip_1*C_1)+C0$$

A specific equation for the transfer function according to aspects of the various embodiments disclosed herein is:

$$Is=(Ip^4*C4)+(Ip^3*C3)+(Ip^2*C2)+(Ip*C1)+C0$$

In this equation, "Is" is the secondary current and "Ip" is the primary current. The equation coefficients, C0-C4, are determined by experimentation involving a test setup for different temperatures and varying signals to determine outputs over different current levels for a particular type of current transformer. The performance characteristics are determined experimentally for each current transformer configuration at all the fault current and high instantaneous current trip points. The magnitude performance of the current transformers is important for predicting trip pickup levels. The current sensing signal width is important for digital sampling constraints, specifically for single-phase scenarios. The following table indicates exemplary values for the coefficients at various current ratings.

| CT Turns | Breaker Models And Range | Min [Apk] | Max [Apk] | Is = f(Ip) in [Apk] Is = (Ip^4*C4) + (Ip^3*C3) + (Ip^2*C2) + (Ip*C1) + C0 |
|---|---|---|---|---|
| 3 | 30A Low Range | 10 | 160 | C0 = 1.52091E−3, C1 = 7.26178E−3 C2 = 0.00000E+0, C3 = 0.00000E+0 C4 = 0.00000E+0 |
| 3 | 30A High Range | >160 | 780 | C0 = 5.63000E−2, C1 = 8.57309^E−3 C2 = −1.18820E−5, C3 = 9.83414E−9 C4 = −3.37802E−12 |
| 1 | 50A, 100A, 150A Low Range | 100 | 600 | C0 = 2.26100E−2, C1 = 2.33988^E−3 C2 = 0.00000E+0, C3 = 0.00000E+0 C4 = 0.00000E+0 |
| 1 | 50A High Range | >600 | 1300 | C0 = −0.50930^E+0, C1 = 4.70000E−3 C2 = −3.08720E−6, C3 = 8.89400E−10 C4 = 0.00000E+0 |
| 1 | 100A, 150A High Range | >600 | 3600 | C0 = 3.81300E−1, C1 = 1.96374E−3 C2 = −3.89390E−7, C3 = 3.13692E−11 C4 = 0.00000E+0 |
| 1 | 250A | 950 | 4250 | C0 = 2.94180E−1, C1 = 1.01895E−3 C2 = −1.08935E−7, C3 = 5.72197E−12 C4 = 0.00000E+0 |

A calibration point or points are determined for the testing and calibration process described in more detail below. A single calibration current or point may be selected for a range of trip points or two or more calibration points may be selected for each different desired range of trip points. A calibration current or point is selected based on different candidates of current levels. In this example, four potential candidates of current levels are tested to determine a calibration current which will meet acceptable calibration standards. The candidates are selected depending on the desired operating range of the current transformer. For example, different candidates of current levels may be selected near the transition to the saturation region of a specific current transformer if the desired current range is primarily in the linear region. In this example, the calibration point or points are stored at the high temperature curve 800 in FIG. 8 to the nominal templates. The high temperatures may be temperatures that are high relative to an ambient temperature of 25° C. such as 90 C or 110° C. The storage of calibration points at a higher temperature level prevents nuisance tripping when errors occur in the temperature calibration system. The scaling of the calibrated values is performed on the nominal templates that are derived from the elevated or relatively high temperatures.

The different candidates for calibration points are each calibrated via the device under test (DUT) with the tester unit 502 in accordance with procedures detailed below to obtain a scaling factor. The DUT is removed from the tester unit 502 and the response at some or all of the current trip points are measured. The corresponding customized calibration tables for each are stored and the values at the trip points from the tables are compared with actual response at some or all of the trip points from the DUT. The candidate with the minimal amount of error across some or all of the trip points is selected as the calibration point for production testing. For units with different ranges, each calibration point candidate is compared with the corresponding trip points within the desired ranges.

With regard to the signal chain, the characteristic equation and average resistance for the burden resistor 412 and the on state of the burden resistor control FET 412 is used to produce a normalized table of trip points.

Figure 9:
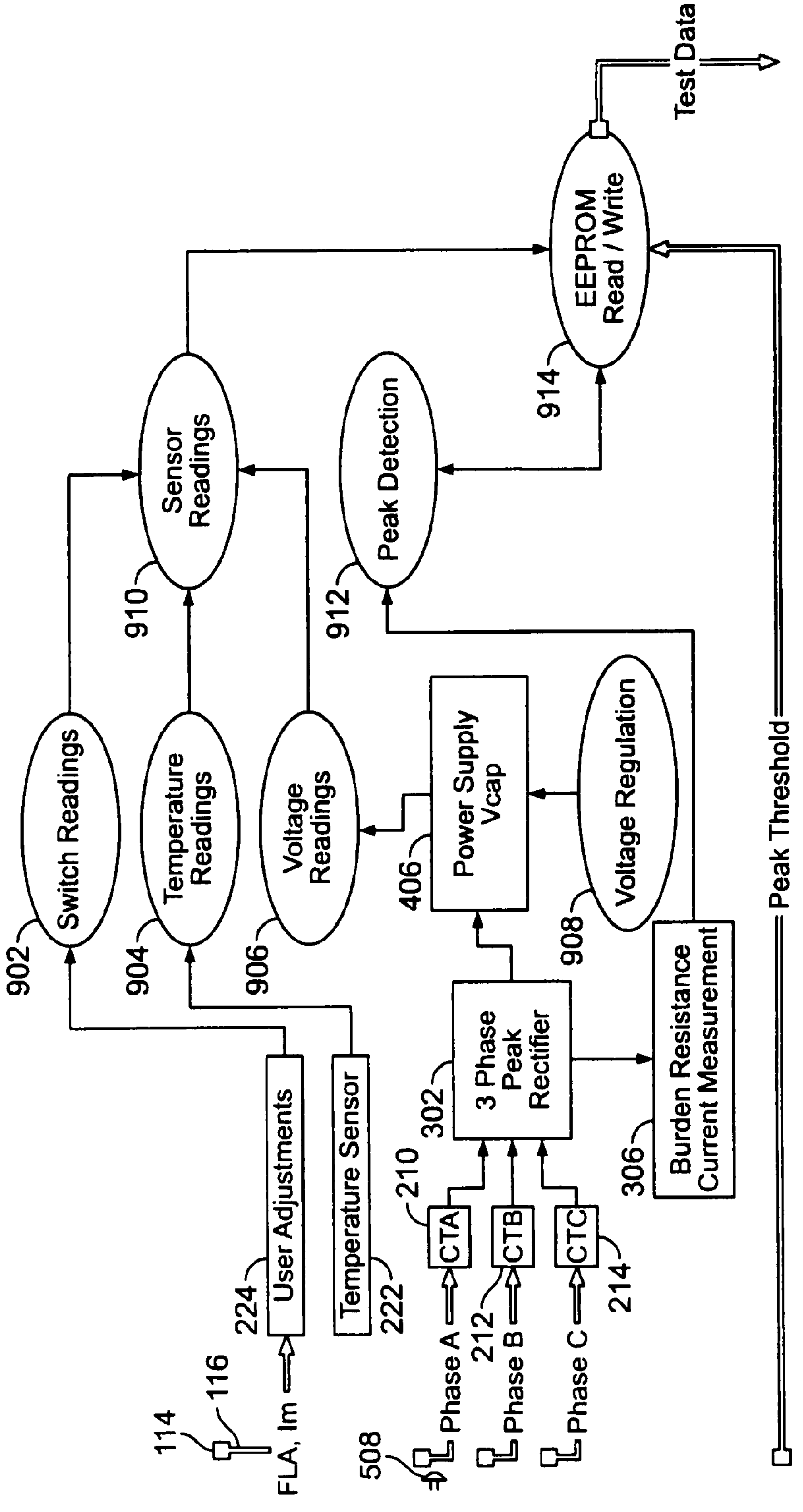
FIG. 9 is a functional block diagram of the operating components of the calibration software of the calibration system in FIG. 5.

FIG. 9 is a functional block diagram of the components of the calibration software 530 when installed in conjunction with the hardware components of the motor circuit protector 100. The calibration software 530 has a switch reading module 902, a temperature readings module 904, a voltage readings module 906, a voltage regulation module 908, a sensor readings module 910, a peak detection module 912 and a read/write module 914.

The switch reading module 902 receives inputs from the user adjustments circuit 224 during the testing process and provides switch data in response to test signals. The temperature readings module 904 receives inputs from the temperature sensor circuit 222 and provides temperature test data. The temperature readings module 904 records raw temperature sensor readings when triggered. These readings and tester fixture temperature data determine the temperature sensor offset sign and magnitude. The temperature sensor offset is written by the read/write module 914 to the EEPROM 270 by the production test software 520. Given the production test software 520 is operating within calibration temperature limits, the difference from the nominal temperature reading may be determined. If the sensor reading from the temperature readings module 904 is greater than the nominal, the read/write module 914 writes a positive offset to the EEPROM 270. Conversely, a negative difference will result in the read/write module 914 writing a negative offset to the EEPROM 270.

The voltage readings module 906 is coupled to the power supply capacitor input circuit 406 and provides voltage readings by injecting a test voltage from the power supply capacitor input circuit 406 to determine any needed voltage offset to the microcontroller 226. The voltage regulation module 908 may provide voltage regulation for the motor circuit protector 100 during the calibration process.

The sensor readings module 910 receives switch reading data, temperature data, and voltage data from the switch, temperature and voltage modules 904, 906 and 908, respectively, and sends the readings to the read/write module 914 that writes the test data into the EEPROM 270 for retrieval by the production test software 520. The peak detection module 912 is coupled to the burden resistor circuit 306 and reads the peak current data in response to test currents that are injected to the three current transformers 210, 212 and 214 via the current output 508. The peak detection data is sent to the read/write subroutine 914 for storage on the EEPROM 270.

Referring to both FIGS. 5 and 9, the production test sequence implemented by the calibration and testing system 500 to gather sensor information can either be initiated with an Auto Trigger or by a Primary Current Trigger mode. The Auto Trigger mode is used by the sensor reading subroutine 910 to gather sensor data that does not depend on primary current injection, such as the switch readings from the switch readings subroutine 902. The current calibration test sequences associated with the Primary Current Trigger mode of operation allows the communications interface 506 and the signal connector 510 to be disconnected during primary current injection to reduce signal noise.

The Auto Trigger mode is configured by the voltage readings subroutine 906 of the production test software 520, which sets a peak threshold value to 0 in the EEPROM 270 while applying a voltage to the energy storage circuit 304. The applied voltage should be greater than the required product startup voltage, which in this example is 16 volts, the voltage level sufficient to start the power supply Vcap circuit 304. The Primary Current Trigger mode is adjusted in order to capture the synchronized peak current and secondary current signals at the specified calibration level. This mode is initiated by setting the peak threshold value to a value on the signal chain and expected tolerances for the particular motor circuit protector 100. Once the threshold value is exceeded, the current peaks are recorded by the calibration software 530.

The production test software 520 injects a targeted primary calibration current in all three phases to the current transformers 210, 212, and 214. The primary calibration current is determined by the process described above. The secondary currents of the current transformers 210, 212, and 214 are rectified by the three-phase rectifier 302. The calibration software 530 is programmed in the microcontroller 226 to record the first eight peaks of the secondary current from the three-phase rectifier 302 after the secondary current exceeds the peak threshold. The production test software 520 injects an actual current into one pole of motor circuit protector 100 for a sufficient duration for the calibration software 530 to record the eight peaks. The peaks are written into the EEPROM 270 in decimal count values via the read/write subroutine 270. The production test software 520 records the peaks of the input actual current and matches those with the peaks recorded by the calibration software 530 in the EEPROM 270. This process is repeated for the other two current transformers 212 and 214. The sensor responses are recorded in specific locations in the EEPROM 270 by the read/write module 914.

After the sensor responses are recorded by the calibration software 530, the communications interface 506 is reconnected to the EEPROM 270. The responses are read by the production test software 520 to determine whether the nominal template values need to be scaled. In general there are one or two scaling constants determined for each motor circuit protector depending on the response characteristics or transfer function for the type of motor circuit protector. The production test software 520 determines the scaling factors for the normalized template to produce the customized calibration table loaded into the EEPROM 270. The scaling factors are determined by calculating temperature and current magnitude scaling constants or adjustment factors. The peak current scaling constants are applicable over specified current ranges set forth in the calibration specifications for the type of motor circuit protector 100. The temperature scaling constants are applicable over all operating current ranges. The temperature scaling constant is a function of the ambient temperature of the motor circuit protector 100 to be tested. This adjustment factor compensates for burden resistor changes with temperature.

Overall scaling constants are calculated by combining the temperature and current magnitude scaling constants. In this example, there is a single scaling region corresponding to a distinct calibration component for the motor circuit protector 100. However, for motor circuit protectors with differing current ranges, there may be two scaling regions corresponding to two distinct calibration currents, namely a high range and a low range. The “A” and “B” region trip points in the normalized table are converted to equivalent values by applying the scaling factor and rounding the resulting values.

All trip points corresponding to the “C” region are scaled with a table lookup function. The normalized table includes normalized codes. These normalized codes are stored in a comparator threshold lookup table with corresponding secondary current comparator values that is referenced by the test production software 520. The overall scaling constants determined by the production test software 520 are multiplied by the normalized secondary current comparator values and then rounded down to the nearest secondary current comparator level. The new secondary current comparator values are translated back to the applicable codes. The new codes are written to the customized calibration table for loading in the EEPROM 270. After loading the customized calibration table in the EEPROM 270, the test production software writes the control algorithm 230 into the flash memory 272. In this example, the control algorithm 230 overwrites the space occupied by the calibration software 530 in the flash memory 272 to conserve memory space for the production ready motor circuit protector 100. The motor circuit protector 100 is now calibrated and ready for use.

The production test and calibration process has restrictions on manipulation of the nominal templates implemented with the calibration software 530. The trip value adjustments are made within the limits of expected burden resistances and temperatures for the particular motor circuit protector. It is to be understood that different motor circuit protectors with different operating ranges have different normalized calibration templates. Also, the nominal template is altered by the production calibration process if the data recordings of the signal chain differ from the nominal values. Sensor readings and calibration data are bounded by a maximum current error and current delta error. The maximum current error is an absolute difference of the equivalent primary current from the synchronized actual primary current injected by the production test software 520. The current delta error is a difference error between the three current transformers 210, 212, 214.

Figure 10:
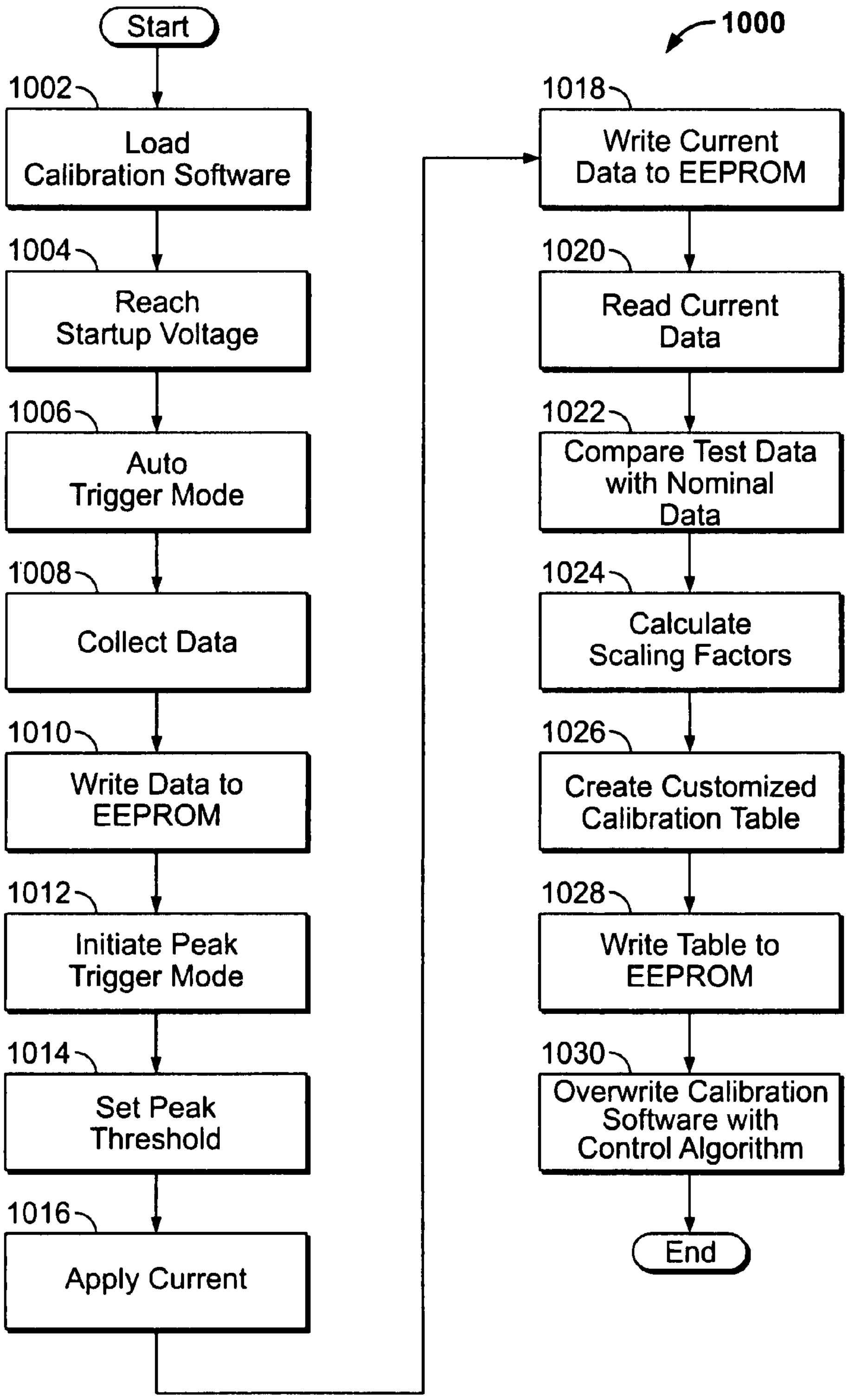
FIG. 10 is a flow chart diagram of the calibration process that is employed by the calibration system in FIG. 5.

An example flow diagram 1000 of the production test software 520 and the calibration software 530 for testing and calibration of the motor circuit protector 100 is shown in FIG. 10. In this example, the machine-readable instructions comprise an algorithm for execution by: (a) a processor, (b) a controller, and/or (c) any other suitable processing device. The algorithm may be embodied in software stored on a tangible medium such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device other than a processor and/or embodied in firmware or dedicated hardware in a well known manner (e.g., it maybe implemented by an application specific integrated circuit (ASIC), a programmable logic device (PLD), a field programmable logic device (FPLD), discrete logic, etc.). Also, some or all of the machine-readable instructions represented by the flowchart of FIG. 10 may be implemented manually. Further, although the example algorithm is described with reference to the flowchart illustrated in FIG. 10, persons of ordinary skill in the art will readily appreciate that many other methods of implementing the example machine readable instructions may alternatively be used. For example, the order of execution of the blocks may be changed, and/or some of the blocks described may be changed, eliminated, or combined.

The example test sequence is as follows. The calibration software 530 is loaded into the flash memory 272 of the motor circuit protector 100 to be tested (1002). The calibration software 530 initializes itself and waits a set delay (4 ms in this example) for a startup voltage to be reached (1004). Once the startup voltage is reached, the test production software 520 configures the auto trigger mode (1006). In the auto trigger mode, the test production software 520 reads test data from the various sensors via the readings modules. In this example, the dials 114 and 116 are set to their maximum and minimum settings, which are received by the user adjustments circuit 224, converted to corresponding digital values indicative of the respective maximum and minimum positions of the dials, and provided to the switch reading module 902. Of course other settings for the dials 114 and 116 may be tested and calibrated. A test voltage is applied to the power supply capacitor input circuit 406, whose value is read by the voltage readings module 906. The temperature readings module 904 reads temperature sensor 222, which provides a voltage indicative of the temperature. The resulting test data is collected (1008) and the calibration software 530 records the test data in the EEPROM 270 via the read/write module 914 (1010). It is to be understood that blocks 1006, 1008 and 1010 are optional test routines and any or all of them may be carried out subsequent to the current injection or not at all depending on the desired test process.

The peak trigger mode is initiated that samples the input current for the trigger threshold (1012). The input current peak threshold is set to a desired value by the test production software 520 writing the desired value to the EEPROM 270 (1014). The input current peak threshold is selected depending on the desired operational range of the motor circuit protector 100. The inputs of the current transformers 210, 212 and 214 are stimulated with current signals (1016) one at a time or simultaneously. The peak detection module 912 detects eight half cycle peak samples for calibration purposes and sends the peak sample data to the read/write module 914. The read/write module 914 writes the peak sample data in the EEPROM 270 (1018). The production test software 520 reads the peak sample data stored in the EEPROM 270 (1020).

The production test software 520 compares the input signals with the test data (1022). The production test software 520 determines the scaling factors for the template for the motor circuit protector 100 under test (1024). The scaling factors are used to modify the nominal template to create a customized calibration table for the motor circuit protector 100 under test (1026). The customized calibration table is written to the EEPROM 270 (1028). The control algorithm 230 then is written over the calibration software 530 (1030) once the calibration is complete.

An advantage of the calibration techniques above is the employment of flexible software architecture that accommodates trip point adjustments between MCP limits without changing the source code for the MCP. The use of the separate testing software and calibration software enables the calibration process to be controlled by software engineering part releases. Also, the software architecture allows the product software code to have high commonality across circuit breakers with different operational current ranges. The flexible software architecture and implementations reduce product test times while maintaining product test coverage. The calibration also is repeatable, which results in low variance in trip points for different calibrations of the same unit. Although the examples described above relate to a single calibration point, it is to be understood that multiple calibration points may be used for breakers using different linear and/or non-linear regions of the current transformers. Although the examples above relate to motor circuit protectors, any industrial control device or circuit breaker with an electronic controller may be calibrated in accordance with the techniques and implementations described above. Moreover, although different memory devices store the calibration software and the calibration data, it is to be understood the same memory device may store both the calibration software and the calibration data. Of course the storage devices 270 and 272 shown in FIG. 2 may be any suitable rewritable memory device such as RAM.

Figure 11:
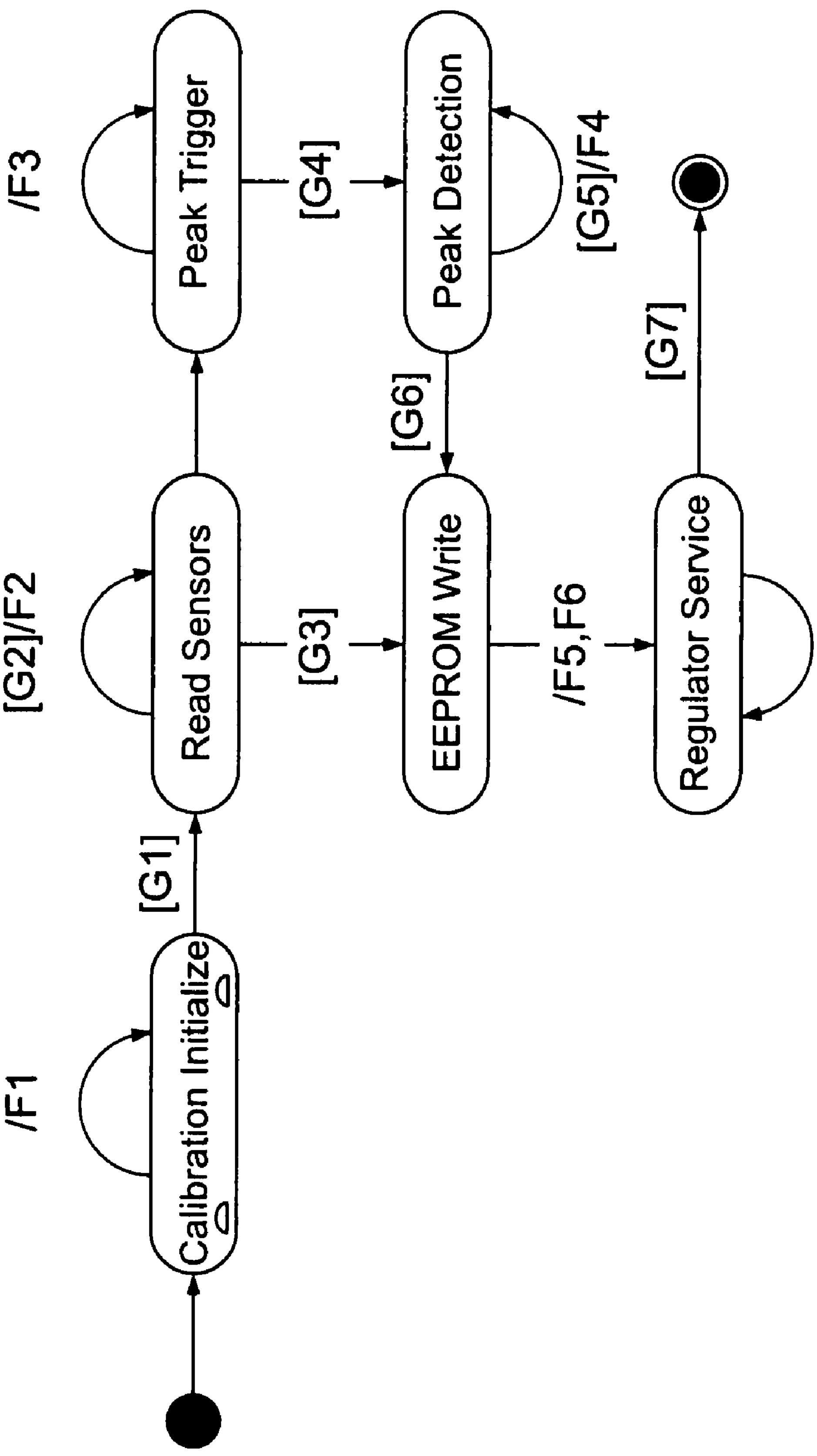
FIG. 11 is calibration state diagram in Unified Modeling Language (UML) according to aspects of various embodiments disclosed herein.

FIG. 11 is a calibration state diagram in Unified Modeling Language (UML) according to aspects of the various embodiments disclosed herein. The following guards and actions are applicable to FIG. 11:

| Guard | Description |
|---|---|
| G1 | Voltage Supply >15 Vdc |
| G2 | Delay 4 ms and then read sensors (FLA, Im, Vs and Ts) |
| G3 | Auto-trigger Mode |
| G4 | Current Sample Triggers Peak Detection |
| G5 | Half Cycle Completed, ~8 ms |
| G6 | Eight Peak Detection Samples Complete |
| G7 | Power Supply Low |

| Action | Description |
|---|---|
| F1 | Monitor Comparator Voltage |
| F2 | Read Sensors (FLA, Im, Vs and Ts) |
| F3 | Get Current Samples for Trigger |
| F4 | Get Peak Current Samples |
| F5 | Sensors to EEPROM (FLA, Im, Vs, Ts) |
| F6 | Peak Currents to EEPROM (Is) |

The calibration initialize state initializes the calibration system and waits for the startup voltage to be reached. The Read Sensors state records the A/D readings for the analog inputs, FLA, Im, Vs, and Ts. The Peak Trigger state samples the input current for a trigger threshold. The Peak Detection state records half-cycle peak samples for calibration purposes. The Regulator Service state maintains power supply voltage until power is removed.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method of calibrating a circuit breaker having a signal chain including a current transformer, a burden resistor, a stored energy circuit, and a controller, the circuit breaker including a memory coupled to the controller, the method comprising:

writing a calibration instruction routine in a first location of the memory;

connecting a current injector to the current transformer;

injecting a test current into the circuit breaker signal chain at a high temperature by the test current injector, the test current having a test current peak;

measuring the test current peak of the test current in the circuit breaker signal chain via the controller;

storing test current peak data indicative of the test current peak in a second location of the memory;

reading the test current peak data from the second location of the memory via a communications interface;

comparing the test current peak data with nominal current data related to the test current;

determining a calibration factor based on the comparison;

creating, by the controller, a specialized calibration table based on the calibration factor and a nominal template modeled from the current transformer; and writing the specialized calibration table to the second location of the memory.

2. The method of claim 1, further comprising:

preparing the specialized calibration table from the calibration factor and the nominal template modeled from the signal chain, the nominal template being based upon a transfer function of the current transformer at a high temperature.

3. The method of claim 2, further comprising replacing the calibration instruction routine in the first location in memory with a control algorithm.

4. The method of claim 2, wherein the nominal template is modeled from the signal chain performance at a high temperature level relative to an ambient temperature level.

5. The method of claim 1, further comprising obtaining test data from additional sensors in the circuit breaker via input of data signals to the additional sensors via a data connector.

6. The method of claim 5, wherein the additional sensors include at least one of a temperature sensor circuit, a voltage sensor circuit, and a user input switch sensor.

7. The method of claim 5 further comprising disconnecting the data connector during the injection of the test current.

8. The method of claim 1, wherein the measuring the peak test current is initiated after the test current exceeds a threshold value.

9. The method of claim 8, wherein the circuit breaker is a motor circuit protector and the threshold value is selected based on a current protection range for the motor circuit protector.

10. The method of claim 1, wherein the first location in the memory is a flash memory and the second location in the memory is an EEPROM.

11. The method of claim 1, further comprising:

injecting a second test current in the circuit breaker signal chain;

measuring a second test current peak of the second test current in the circuit breaker signal chain;

storing second test current peak data indicative of the second test current peak in the second location of the memory;

reading the second test current peak data;

comparing the second test current peak data with nominal current data related to the signal chain; and determining a second calibration factor based on the comparison, wherein the first calibration factor relates to a first current range of operation for the circuit breaker and the second calibration factor relates to a second current range of operation for the circuit breaker.

12. A testing system to calibrate a circuit breaker for detecting a current range, the circuit breaker including a current transformer, a burden resistor, a stored energy circuit, a controller, a first memory location and a second memory location, the memory locations coupled to the controller, the testing system comprising:

a set of calibration instructions stored in the first memory location;

a test current injector connectable to the current transformer, the test current injector injecting a test current to the current transformer at a high temperature, wherein the calibration instruction set causes the controller to measure the peak test current injected and write a peak current value to the second memory location;

a data communications interface in communication with the second memory location to read the peak current values; and a test instruction set to calculate a calibration factor based on a comparison of the peak current value with data relating to the test current, wherein the test instruction set creates a specialized calibration table based on the calibration factor and a nominal template modeled from the current transformer; and wherein the test instruction set causes the data communications interface to write the specialized calibration table to the second memory location.

13. The testing system of claim 12, wherein the test instruction set causes the data communications interface to overwrite the calibration instruction routine in the first memory location with a control algorithm.

14. The testing system of claim 12, further comprising a data signal connector connectable to additional sensors in the circuit breaker.

15. The testing system of claim 14, wherein the additional sensors include at least one of a temperature sensor circuit, a voltage sensor circuit, and a user input switch sensor.

16. The testing system of claim 12, wherein the nominal template is modeled from the current transformer performance at a high temperature level relative to an ambient temperature level.

17. The testing system of claim 12, wherein the controller measures the peak test current after the test current exceeds a threshold value.

18. The testing system of claim 12, wherein the first memory location is a flash memory and the second memory location is an EEPROM.

19. The testing system of claim 12, wherein the high temperature is at least 90 degrees C.

20. An article of manufacture for calibrating a signal chain of a circuit breaker, the signal chain including a current transformer, a burden resistor, a stored energy circuit and a controller, the circuit breaker including a memory accessible to the controller, the article of manufacture comprising:

a non-transitory computer readable medium; and a plurality of instructions wherein at least a portion of said plurality of instructions are storable in said non-transitory computer readable medium, and further wherein said plurality of instructions are configured to cause the controller to perform:

measuring at a high temperature a test current peak of a test current injected in the circuit breaker signal chain;

storing data indicative of the test current peak in the memory;

calculating a calibration factor based on a comparison of the data indicative of the test current peak with data relating to the test current;

creating a specialized calibration table based on the calibration factor and a nominal template modeled from the current transformer; and storing the specialized calibration table.

21. The article of manufacture of claim 20, wherein the plurality of instructions are configured to cause the controller to perform measuring sensor data from sensors in the circuit breaker; and storing the sensor data in the memory.

22. The article of manufacture of claim 20, wherein the plurality of instructions are configured to cause the controller to perform:

measuring a second test current peak of a second test current injected in the circuit breaker signal chain; and storing data indicative of the second test current peak in the memory.

* * * * *